(12) United States Patent
Hosaka

(10) Patent No.: US 6,544,852 B1
(45) Date of Patent: Apr. 8, 2003

(54) METHOD OF FABRICATING SEMICONDUCTOR DEVICE

(75) Inventor: Takashi Hosaka, Tokyo (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 08/093,983

(22) Filed: Jul. 19, 1993

Related U.S. Application Data

(63) Continuation of application No. 07/801,752, filed on Dec. 3, 1991, now abandoned.

(30) Foreign Application Priority Data

| Dec. 4, 1990 | (JP) | ............................................... 2-400357 |
| Dec. 6, 1990 | (JP) | ............................................... 2-400711 |
| Dec. 6, 1990 | (JP) | ............................................... 2-400712 |

(51) Int. Cl.$^7$ ............................................ H01L 21/336
(52) U.S. Cl. ...................... 438/305; 438/299; 438/671
(58) Field of Search ........................... 437/44, 40, 41, 437/228, 233, 912, 57, 58, 59, 186, 47; 148/DIG. 53; 438/305, 299, 303, 671, 197, 595

(56) References Cited

U.S. PATENT DOCUMENTS

| 4,735,916 A | * | 4/1988 | Homma et al. | .............. 437/152 |
| 4,810,666 A | * | 3/1989 | Taji | .............. 437/30 |
| 4,849,369 A | * | 7/1989 | Jeuch et al. | .............. 437/228 |
| 4,902,640 A | * | 2/1990 | Sachitano et al. | ...... 148/DIG. 9 |
| 4,992,389 A | * | 2/1991 | Ogura et al. | .................... 437/43 |
| 4,994,402 A | * | 2/1991 | Chiu | .............. 437/228 |
| 5,010,039 A | * | 4/1991 | Ku et al. | .................... 437/186 |
| 5,015,598 A | * | 5/1991 | Verhaar | ........................ 437/233 |
| 5,022,958 A | * | 6/1991 | Farreau et al. | .................. 437/40 |
| 5,180,689 A | * | 1/1993 | Liu et al. | ...................... 437/228 |
| 5,236,851 A | * | 8/1993 | Kameyama et al. | ............ 437/47 |

FOREIGN PATENT DOCUMENTS

| JP | 0276271 | * | 11/1988 | .................... 437/41 |
| JP | 0110772 | * | 4/1989 | .................... 437/41 |

OTHER PUBLICATIONS

Ghandhi, VLSI Fabrication Principles, pp 534–538, 542–548, 1983.*

* cited by examiner

Primary Examiner—Michael Trinh
(74) Attorney, Agent, or Firm—Adams & Wilks

(57) ABSTRACT

In a method for forming a self-aligned contact in a MOS-type semiconductor device, a gate electrode film is deposited on a semiconductor substrate and an insulating film is deposited on the gate electrode film. The gate electrode film and the insulating film are then patterned such that the portion of the device where the two films are located is higher than any other regions of the device. A side wall insulating film is formed on the side wall of the gate electrode and the insulating film. Source and drain regions are formed in the face of the substrate using the patterned gate electrode film as a mask. A conductor film is then deposited on the exposed surface of the semiconductor substrate, the first insulating film and the side wall insulating film. A flattening film is then deposited to flatten the surface of the semiconductor, and a region of the flattened film and the conductor film which is above the gate electrode film is etched, using a photoresist film as a mask. As a result, the thickness of the photoresist film used as a mask in etching the conductor film is thinnest at the portion above which are located the insulating film and the gate electrode. Consequently, an open space in the photoresist film can be made smaller than the width of the gate electrode, so as to prevent accidental etching of the source and drain regions.

6 Claims, 3 Drawing Sheets

METHOD OF FABRICATING SEMICONDUCTOR DEVICE

This is a continuation of parent application Ser. No. 07/801,752 filed Dec. 3, 1991 now abandoned.

BACKGROUND OF THE INVENTION

1. Field of the Invention

The present invention relates to a production method for forming a self-aligned contact in a MOS-type semiconductor device.

2. Description of the Related Art

FIG. 3 is a sectional view of a conventional semiconductor device having a gate electrode 24, a wiring layer 36, and so forth. A contact hole 33 is formed by effecting positioning by photo-lithography after an inter-level insulating film 35 is formed. Therefore, a margin comprising the sum of a positioning error $\delta$ and variance $\lambda$ at the time of etching must always be taken into consideration. Assuming that the distance between the edge of the gate electrode 24 and the edge of a contact hole 33 is n, for example, the relation $n > \delta + \lambda$ must be satisfied. This is a great obstacle when a semiconductor device is miniaturized. In a 0.8 $\mu$m rule, for example, $\delta=0.4$ $\mu$m and $\lambda=0.2$ $\mu$m; hence, $n>0.6$ $\mu$m. From the aspect of a process margin, n must be about 0.8 $\mu$m.

It is thus desirable to reduce the size of a semiconductor device by reducing as much as possible the distance n between the edge of the contact hole and the gate electrode described above and the distance p between the contact hole and a device isolation layer 22.

SUMMARY OF THE INVENTION

It is an object of the present invention to provide a method of fabricating a MOS device comprising forming a gate insulating film on a semiconductor substrate, forming a gate electrode film on the gate insulating film, forming a first insulating film on the gate electrode film, patterning the gate electrode film and the first insulating film by using a first patterned photoresist film as a mask, forming impurity source and drain layers in the semiconductor substrate by using the patterned gate electrode film as a mask, forming a second insulating film on the exposed surface of the gate insulating film and the first insulating film, etching the second insulating film to form a side wall insulating film on the side wall of the gate electrode and to expose a surface of the semiconductor substrate, forming a conductor film on the exposed surface of the semiconductor substrate, the first insulating film and the side wall insulating film, and patterning the conductor film in a desired shape.

Another object of the invention is to provide a method of fabricating a MOS device comprising forming a gate insulating film on a semiconductor substrate, forming a gate electrode film on the gate insulating film, forming a first insulating film on the gate electrode film, patterning the gate electrode film and the first insulating film by using a first patterned photoresist film as a mask, forming impurity source and drain layers on a face of the semiconductor substrate by using the patterned gate electrode film as a mask, forming a second insulating film on the exposed surface of the gate insulating film and the first insulating film, etching the second insulating film to form a side wall insulating film on the side wall of the gate electrode and to expose a surface of the semiconductor substrate, forming a conductor film on the exposed surface of the semiconductor substrate, the first insulating film and the side wall insulating film, forming a film having a flattening face on the conductor film, and etching a region of the flattened film and the conductor film in the region above the gate electrode film, using a second patterned photoresist film as a mask.

After the gate electrode film and the insulating film disposed on the gate electrode film are simultaneously etched and patterned, a side wall insulating film is formed on the side wall of the gate electrode film by an etch-back method. A conductor film is then formed so as to bring impurity source and drain layers into direct contact with the conductor film, and thereafter the conductor film is patterned in a desired shape.

Since the gate electrode is covered with the upper insulating film and the side wall insulating film, the conductor film can be formed over them in contact with impurity source and drain layers without using an inter-level insulating film which is used in the prior art. As a result, since a mask for forming a contact is not necessary, the semiconductor device can be miniaturized.

According to the present invention, the above-mentioned problems are solved by utilizing the fact that the vicinity of the gate electrode is higher than other regions of the device. That is, after the conductor film is formed, a flattening film is deposited to flatten the surface of the semiconductor device, and the conductor film on the gate electrode is then patterned only over a region that is to be etched.

The flattening film on the gate electrode film is etched, and then the conductor film is etched. The conductor film on the gate electrode film is higher than on other regions, and therefore the conductor film on the gate electrode film is etched preferentially.

After the gate electrode film and a silicon nitride film disposed on the gate electrode film are simultaneously etched and patterned, a silicon nitride film is formed on the side wall of the gate electrode film by an etch-back method, a conductor film is then formed so as to bring impurity source and drain layers into direct contact with the conductor film, and thereafter the conductor film is patterned in a desired shape.

Since the gate electrode is covered with the upper silicon nitride film and the side wall silicon nitride film, the conductor film can be formed over them in contact with impurity source and drain layers without using an inter-level insulating film. Again, since a mask for forming a contact is not necessary, the semiconductor device can be miniaturized.

DETAILED DESCRIPTION OF THE PREFERRED EMBODIMENTS

Figure 1A:
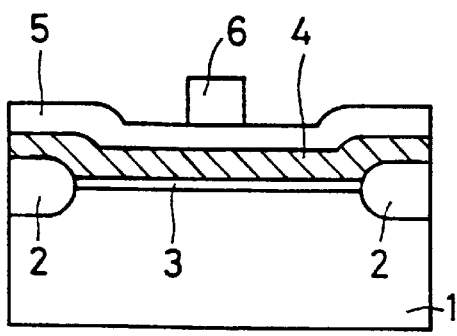
FIGS. 1(a)–(h) are sectional views showing step-wise the method of fabricating a semiconductor device according to the present invention.

FIGS. 1(a)–(h) show an embodiment of a fabrication method of a metal-oxide-semiconductor (MOS) having a self-alignment type contact structure according to the present invention. As shown in FIG. 1(a), an insulating film 2 for device isolation and a gate insulating film 3 are formed on a semiconductor substrate 1 made of silicon or the like, and then a film 4 which will serve as a gate electrode and a wiring, and a first insulating film 5 to be disposed on the gate electrode film 4 are laminated. Patterning is then conducted to form the gate electrode by the use of a first photoresist film 6, etc. The gate electrode film 4 consists of a polycrystalline silicon film or silicide film, a metal film or their composite film. Examples of the insulating film 5 on the gate electrode film 4 include an oxide film obtained by oxidizing the gate electrode film 4, a nitride film obtained by nitriding the gate electrode film 4, a silicon dioxide film laminated by a chemical vapor deposition (CVD) method or a physical vapor deposition (PVD) method, a silicon nitride film laminated by the CVD method and PVD method, silicon oxynitride film laminated by the CVD method or the PVD method, an insulating film such as alumina, or their composite film.

Figure 1B:
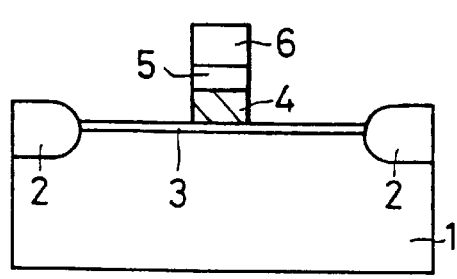

Next, as shown in FIG. 1(b), the first insulating film 5 and the gate electrode 4 are patterned using the patterned first photoresist film 6. In this patterning process, patterning of the first insulating film 5 and patterning of the gate electrode film 4 may be carried out simultaneously or separately.

Figure 1C:
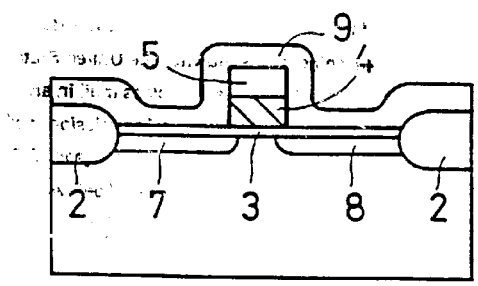

Next, after low concentration impurity source and drain layers 7 and 8 are formed as shown in FIG. 1(c), a second insulating film 9 which will ultimately serve as the side wall insulating film of the gate electrode 4 is laminated. Examples of this insulating film 9 include a silicon dioxide film or silicon nitride film or a silicon oxynitride film formed by the CVD method or the PVD method, or alumina. Heat-treatment such as annealing or oxidation may be effected before the insulating film 9 serving as the side wall insulating film is formed, in order to remove any damage to the gate electrode film 4 due to etching and to stabilize the interface of the silicon substrate 1. The low concentration impurity source and drain layers 7 and 8 are generally referred to as "LDD" (Lightly Doped Drain). These layers may of course be omitted, whenever unnecessary. They can also be converted to the impurity source and drain layers having a higher impurity concentration.

Figure 1D:
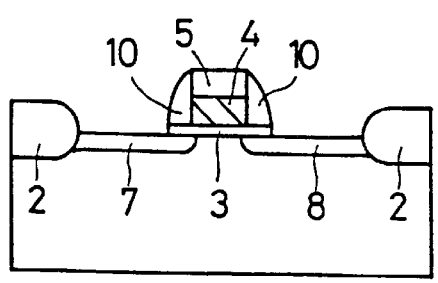

Next, as shown in FIG. 1(d), the second insulating film 9 is etched to form a side wall insulating film 10. This method is referred to as "etch-back" and can generally form the side wall insulating film 10 on the side wall of the gate electrode film 4 by anisotropic etching of the second insulating film 9. The etching depth of the insulating film 9 corresponds substantially to the thickness of the second insulating film 9 and over-etching must somewhat be effected to obtain uniformity of the side wall insulating film 10. At this time, the gate insulating film 3 below the second insulating film 9 or the first insulating film 5 on the gate electrode film 4 is etched to a certain extent and this etching must be taken into consideration. Since the gate insulating film is thin, there is the possibility that this film is fully etched. Therefore, the etching of the second insulating film 9 must be selected so that the silicon substrate 1 below the gate insulating film is not substantially etched. The insulating film on the gate electrode film 4 is etched to a certain extent as well. Therefore, it must have a thickness sufficient to prevent the exposure of the gate electrode film 4 and to provide electric insulation.

Figure 1E:
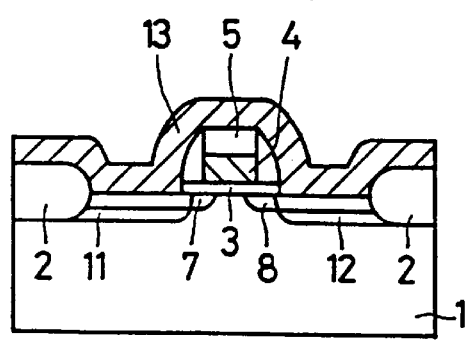

Next, as shown in FIG. 1(e), the impurity source and drain layers 11, 12 having a high impurity concentration are formed and then the first conductor film 13 is formed so as to come into direct contact with the impurity source and drain layers 11 and 12 from above. The impurity source and drain layer 11 and 12 are generally referred to as "HDD" (Heavily Doped Drain).

To establish direct contact in this instance, a thin insulating film on the impurity source and drain layers 11, 12, if any remains there, must be removed before the first conductor film 13 is formed. Examples of this conductor film 13 are a polycrystalline silicon film, a silicide film, a metal film or their composite film.

Figure 1F:
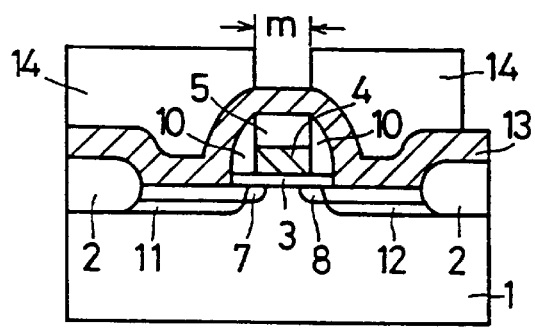

Next, in order to etch the first conductor film 13 in a desired shape, a resist is patterned by photo-lithography or the like, as shown in FIG. 1(f). At this time, a second photoresist film 14 has an open space m as shown in FIG. 1(f) because the first conductor film 13 on the gate electrode must generally be kept disconnected. Generally, when an LSI is miniaturized, the gate electrode is in the minimum rule. The open space m of the second photoresist film 14 is preferably smaller than the width of the gate electrode 4 in order to prevent accidental etching of the source and drain when the conductor film is etched. The space m can be made smaller than the gate electrode in the minimum rule without any problem. This is because the first insulating film 5 exists on the gate electrode 4, and this portion is higher than other portions of the device, and the photoresist can be cut sufficiently even when the length m is secured to the limit of resolution smaller than the minimum rule.

Figure 1G:
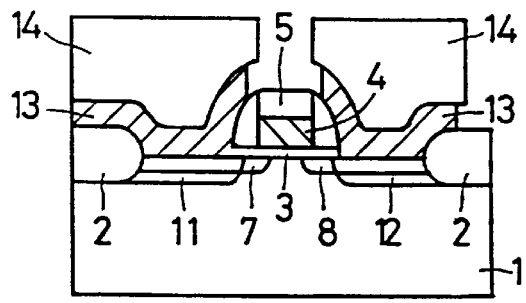

Next, as shown in FIG. 1(g), the first conductor film 13 is etched in a desired shape using the patterned second photoresist film 14 as the mask. At this time, the open portion of the resist over the gate electrode film 4 is cut as well, and the first conductor film 13 is thus separated between the source side and the drain side.

Figure 1H:
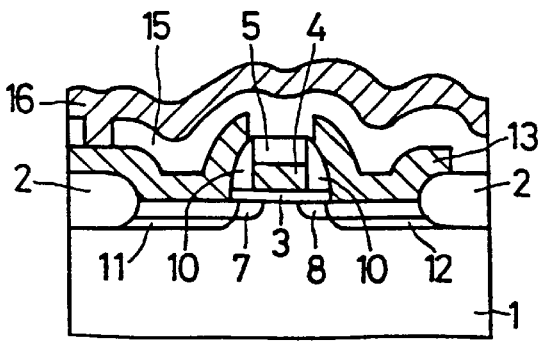

After the second photoresist film 14 is removed, the inter-level insulating film 15 and the second conductor film 16 disposed on the inter-level insulating film 15 are formed as shown in FIG. 1(h), and thus the semiconductor device is fabricated.

Though the direct contact of the first conductor film 13 with the impurity source and drain layers 7, 8, 11, 12 has been explained in FIG. 1, the contact between the first conductor film 13 and the gate electrode film 4 can be established by the following methods. One of the methods increases the number of masking steps and etching steps before the formation of the first conductor film 13 and forms a contact hole in the first insulating film 5 on the gate electrode film 4. Another method forms the first conductor film 13, then opens the contact hole in the inter-level insulating film 15 and thereafter brings the gate electrode film 4 into electrical contact with the second conductor film 16.

The impurity source and drain layers 7, 8 or 11, 12 may be P type or N type.

Since the masking step for the contact hole between the impurity source and drain layers 7, 8, 11, 12 and the first conductor film 13 is not necessary, it is not at all necessary to take into consideration the alignment error with the gate electrode film 4 or the alignment error with the device isolation insulating film 2. Furthermore, the step of exposing the impurity source and drain layers 7, 8, 11, 12 can be carried our by a simple etching step (to remove the oxide film on the surface by hydrofluoric acid (HF) dip, for example).

Figure 3:
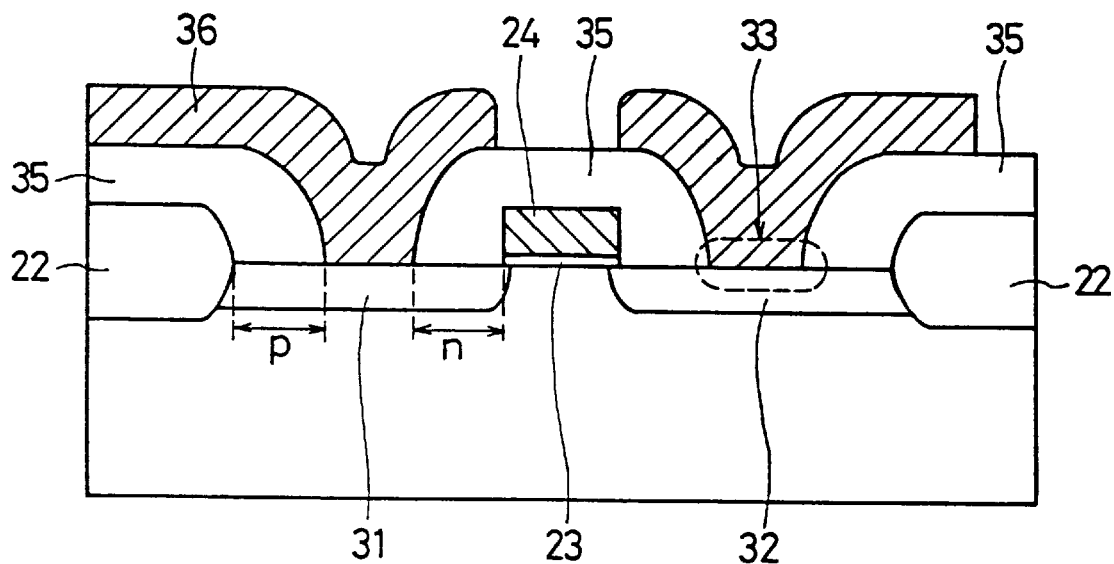
FIG. 3 is a sectional view showing a conventional semiconductor device.

Variance of etching need not be taken into consideration to any great degree. Accordingly, the distance n between the gate electrode film 4 and the edge of the contact hole 33 described in FIG. 3 becomes substantially zero. The distance p between the other edge of the contact hole and the device isolation layer 22 becomes zero, too. In other words, as can be seen from FIG. 1, the side wall insulating film 10 exists between the gate electrode 4 and the first conductor film 13, and this side wall insulating film 10 guarantees electrical insulation between the first conductor film 13 and the gate electrode 4. Therefore, miniaturization of the semiconductor device can be achieved. In the case of the 0.8 μm rule, for example, the gate length 0.8 μm+gate and contact space 0.8 μm+contact hole 0.8 μm+space for separating contact and device 0.6 μm=3.0 μm in the prior art. In the present invention, the gate length 0.8 μm+side wall space width 0.2 μm+contact hole 0.8 μm=1.8 μm. Therefore, the size of the device can be reduced by as much as 1.2 μm.

FIGS. 1(a)–(h) show a fabrication method of a metal-oxide-semiconductor (MOS) having a self-alignment type contact structure according to a second embodiment of the present invention. As shown in FIG. 1(a), an insulating film 2 for device isolation and a gate insulating film 3 are formed on a semiconductor substrate 1 made of silicon or the like, and then a gate electrode film 4 and a first insulating film 5 consisting of a silicon nitride disposed on the gate electrode film 4 are laminated. Patterning for the gate electrode film 4 is then effected by the use of a first photoresist film 6, etc. The gate electrode film 4 consists of a polycrystalline silicon film or silicide film, a metal film or their composite film. The first insulating film 5 consisting of silicon nitride is laminated by a chemical vapor deposition (CVD) method. In other words, it is customary to employ the growth of the silicon nitride film by the reaction between dichlorosilane ($SiH_2Cl_2$) and ammonia ($NH_3$) (reaction formula: $SiH_2Cl_2 + NH_3 \rightarrow Si_3N_4$) or the growth of the silicon nitride film by the reaction between silane ($SiN_4$) and ammonia ($NH_3$) (reaction formula: $SiN_4 + NH_3 \rightarrow Si_3N_4$).

Next, as shown in FIG. 1(b), the silicon nitride film 5 and the gate electrode film 4 are patterned using the patterned photoresist film 6. In this patterning process, patterning of the silicon nitride film 5 and patterning of the gate electrode 4 may be carried out either simultaneously or separately. When simultaneous patterning is carried out, a method which selects an etching gas that permits anisotropic etching of the silicon nitride film 5 and the gate electrode film 4 or a method which sets the etching conditions for the silicon nitride film and for the gate electrode film 4 separately from each other is available.

Next, after low concentration impurity source and drain layers 7 and 8 are formed as shown in FIG. 1(c), a second insulating film 9 consisting of a silicon nitride which will serve as the side wall insulating film 10 of the gate electrode film 4 is laminated. This insulating film 9 is formed by the CVD method in the same way as the first insulating film 5. Heat treatment such as annealing or oxidation may be effected before the silicon nitride film 9 serving as the side wall insulating film 10 is formed, in order to remove and damage to the gate electrode film 4 due to etching and to stabilize the interface of the silicon substrate 1. The low concentration impurity source and drain layers 7 and 8 are generally referred to as "LDD" (Lightly Doped Drain). These layers may of course be omitted, whenever unnecessary. They can also be converted to the original impurity source and drain layers having a higher impurity concentration.

Next, as shown in FIG. 1(d), the silicon nitride film 9 is etched to form a side wall insulating film 10. This method is referred to as "etch-back" and can form the side wall insulating film 10 in self-alignment without the masking step. This etch-back method is generally carried out by anisotropic etching of the silicon nitride film 9. The etching depth of the silicon nitride film 9 corresponds substantially to the thickness of the silicon nitride film 9, and over-etching must be effected to some degree so as to obtain uniformity of the side wall insulating film 10. The gate insulating film 3 generally consists of a silicon dioxide film ($SiO_2$). Therefore, when the silicon nitride film 9 is used, it becomes possible to excessively etch the gate insulating film 3 consisting of the silicon dioxide film, to secure uniformity of the side wall insulating film 10 and to prevent any silicon nitride film from remaining on the gate insulating film by selecting conditions under which the etching rates of the silicon nitride film and silicon dioxide film are different and which has a so-called high "etching selection ratio". (It of course is the region in which the silicon nitride film is removed and does not exist.) The silicon nitride film 5 on the gate electrode film 4 is etched to a certain extent as well. Therefore, it must have a thickness-sufficient enough to prevent the exposure of the gate electrode film 4 and to provide electric insulation with the wiring layer disposed thereon. In other words, a thickness of at least 1,000 Å is necessary for the thickness of the silicon nitride film 5 at the time of lamination. Even when the silicon nitride film 5 is over-etched by 500 Å, the thickness of 500 Å yet remains, and this thickness can sufficiently withstand the subsequent steps. Generally, the thickness y of the silicon nitride film 5 must satisfy the relation $[y > v/100 \times X]$ when the thickness of the silicon nitride film 9 is X Å and over-etching of v% is carried out.

If the withstand voltage of the silicon nitride film at a leak level is 2 MV/cm, the remaining silicon nitride film 9 must be at least 250 Å thick when a power supply voltage is 5 V. The necessary thickness is believed to be 500 Å when a margin is taken into consideration. Therefore, the thickness y of the silicon nitride film is expressed as follows:

$$y > v/100 \times X + 500 \text{ (Å)}$$

Next, as shown in FIG. 1(e), the impurity source and drain layers 11, 12 having a high concentration are formed and then the first conductor film 13 is formed so as to come into direct contact with the impurity source and drain layers 11 and 12 from above. The impurity source and drain layers 11 and 12 are generally referred to as "HDD" (Heavily Doped Drain). To establish direct contact in this instance, a thin insulating film on the impurity source and drain layers 11, 12, if any remains there, must be removed before the first conductor film 13 is formed. This thin insulating film is generally a silicon dioxide film. In other words, there can be a case in which the silicon dioxide film as the gate insulating film remains or a case where the thin insulating film is the silicon dioxide film formed by the oxidation treatment carried out for removing defects and damage that occurs during etching of the silicon nitride film 9 (such a treatment may not be carried out), or a case of a natural oxide film. The best method of removing this thin silicon dioxide film is wet etching by the use of hydrofluoric acid (HF), since it does not damage the semiconductor device. Even when this wet etching is carried out, the silicon nitride film used in the present invention is barely etched, and the gate electrode film 4 is unaffected because the film is covered with the silicon nitride films 5 and 10. Therefore, it is possible to easily expose the impurity source and drain layers 11, 12 and to bring them into contact with the second conductor film 13. Examples of the second conductor film 13 include a polycrystalline silicon film, a silicide film, a metal film, or their composite film.

Next, in order to etch the second conductor film 13 in a desired shape, a resist is patterned by photo-lithography or the like, as shown in FIG. 1(f). At this time, a second photoresist film 14 has an open space m as shown in FIG. 1(f) because the second conductor film 13 on the gate electrode must generally be kept disconnected. Generally, when an LSI is miniaturized, the gate electrode is in the minimum rule. The open space m of the second photoresist film 14 is preferably smaller than the width of the gate electrode 4 in order to prevent accidental etching of the source and drain when the conductor film is etched. The space m can be made smaller than the gate electrode in the minimum rule without any problem. This is because the first insulating film 5 exists on the gate electrode 4, and this portion is higher than other portions of the device, and the photoresist can be cut sufficiently even when the length m is secured to the limit of resolution smaller than the minimum rule.

Next, the first conductor film 13 is etched in a desired shape using the patterned photoresist film 14 as the mask as shown in FIG. 1(g). At this time, the open portion of the resist over the gate electrode film 4 is cut as well, and the first conductor film 13 is thus separated between the source side and the drain side.

After the second photoresist film 14 is removed, the inter-level insulating film 15 and the second conductor film 16 disposed on the inter-level insulating film 15 are formed as shown in FIG. 1(h), and thus the semiconductor device is fabricated.

Though the direct contact of the first conductor film 13 with the impurity source and drain layers 7, 8, 11, 12 has been explained in FIG. 1, the contact between the first conductor film 13 and the gate electrode film 4 can be established by the following methods. One of the methods increases the number of masking steps and etching steps before the formation of the first conductor film 13 and forms a contact hole in the insulating film 5 on the gate electrode film 4. Another method forms the first conductor film 13, then opens the contact hole in the inter-level insulating film 15 and thereafter brings the gate electrode film 4 into electric contact with the second conductor film 16.

The impurity source and drain layers 7, 8 or 11, 12 may be P type or N type.

Since the masking step for the contact hole between the impurity source and drain layers 7, 8, 11, 12 and the conductor film 13 is not necessary, it is not at all necessary to take into consideration the alignment error with the gate electrode film 4 or the alignment error with the device isolation insulating film 2. Furthermore, the step of exposing the impurity source and drain layers 7, 8, 11, 12 can be carried out by a simple etching step (to remove the oxide film on the surface by hydrofluoric acid (HF) dip, for example).

Variance of etching need not be taken in to consideration to any great degree. Accordingly, the distance n between the gate electrode film 4 and the edge of the contact hole 33 described in FIG. 3 becomes substantially zero. The distance p between the other edge of the contact hole and the device isolation layer 22 becomes zero, too. In other words, as can be seen from FIG. 1, the side wall insulating film 10 exists between the gate electrode 4 and the first conductor film 13 and this side wall insulating film 10 guarantees electric insulation between the conductor film 13 and the gate electrode 4. Therefore, miniaturization of t he semiconductor device can be achieved. In the case of the 0.8 $\mu$m rule, for example, the gate length 0.8 $\mu$m+gate and contact space 0.8 $\mu$m+contact hole 0.8 $\mu$m+space for separating contact and device 0.6 $\mu$m=3.0 $\mu$m in the prior art. In the present invention, the gate length 0.8 $\mu$m+side wall space width 0.2 $\mu$m+contact hole 0.8 $\mu$m=1.8 $\mu$m. Therefore, the size of the device can be reduced by as much as 1.2 $\mu$m.

Furthermore, since the gate electrode 4 is covered with the silicon nitride films 5 and 10 in the present invention, the silicon nitride films 5 and 10 are in substantially etched when the wet etching treatment by the use of the etching solution of the HF type is carried out to expose the impurity source and drain layers 11, 12 before the conductor film 13 is formed, as explained in the embodiment, but these films protect the gate electrode 4.

In the present invention, the silicon nitride film 5 is placed on the gate electrode film 4, but an insulating film such as a silicon dioxide film may be sandwiched between them. Examples of the effects of including such an insulating film are stress mitigation and reduction of a leakage current. Another effect is that the insulating film functions as a cut-off or stopper when the silicon nitride film 5 is etched at the time of over-etching of the silicon nitride film 9. The silicon dioxide film described above is formed by oxidation or by the CVD method.

Furthermore, the silicon nitride film 9 is laminated in the described embodiment of the invention, but there is also a method which comprises first laminating another insulating film such as a silicon dioxide film and then laminating the silicon nitride film. The effects of this method are also stress mitigation and reduction of leakage current. Another effect is that the silicon nitride film functions as the cut-off or stopper when the silicon nitride film 9 is over-etched.

Figure 2A:
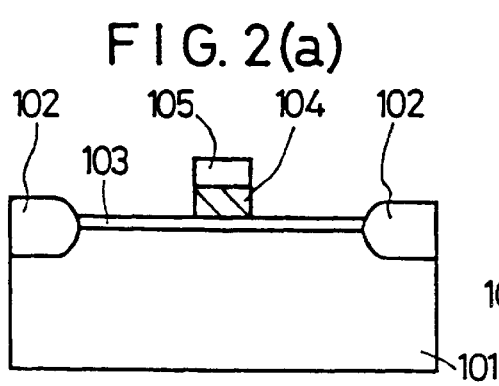
FIGS. 2(a)–(h) are sectional views showing step-wise another embodiment of the method of fabricating a semiconductor device according to the present invention.
Figure 2E:
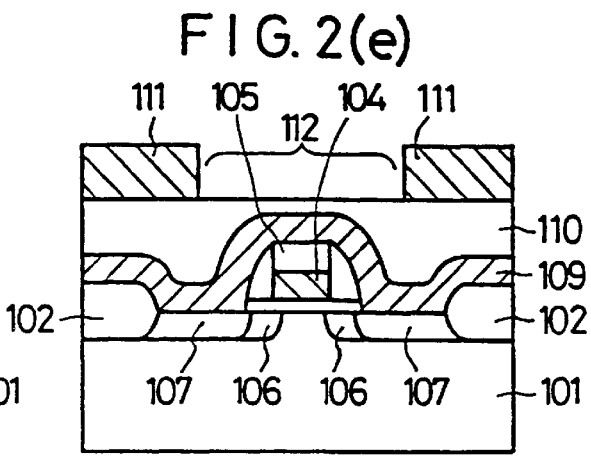
Figure 2B:
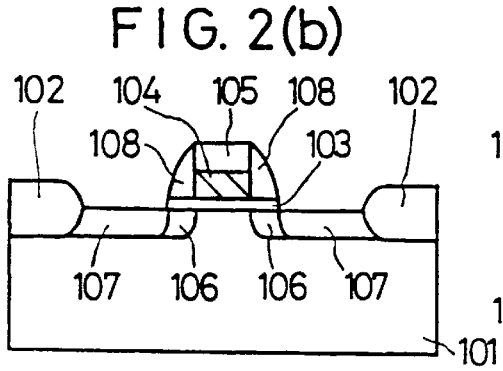

In a third embodiment of the present invention, the initial steps are the same as those of FIG. 1 up to the step of depositing a first conductor film 9. That is, FIGS. 2(a) to 2(c) illustrate the same steps as those of FIGS. 1(a) to 1(e). The gate electrode film 104 is covered with a first insulating film 105 and a side-wall insulating film 108. The first conductor film 109 is in contact with the semiconductor substrate 101 via the source and drain regions 106, 107. Though not shown in FIG. 2, the first conductor film 109 and the semiconductor substrate 101 come into direct contact with each other over a region where there exists neither an insulating film for device isolation 102 nor the gate electrode film 104, since the semiconductor substrate is exposed before the conductor film 109 is deposited. The conductor film 109 may be constructed of a polycrystalline silicon film, a silicide film, a metal film, or laminated films thereof.

Figure 2F:
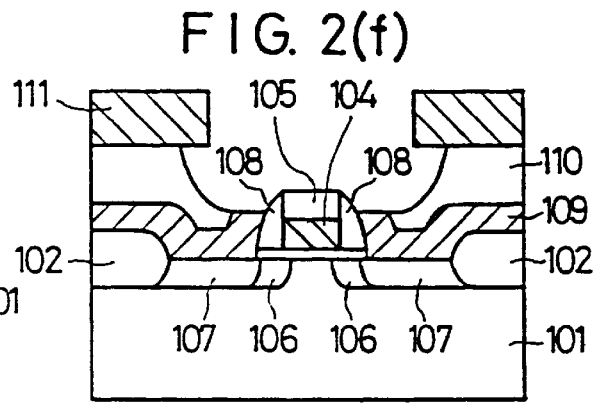
Figure 2C:
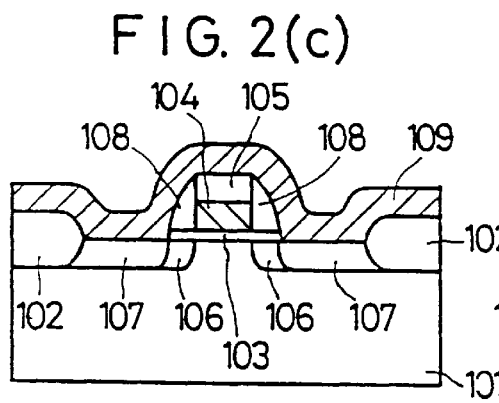
Figure 2G:
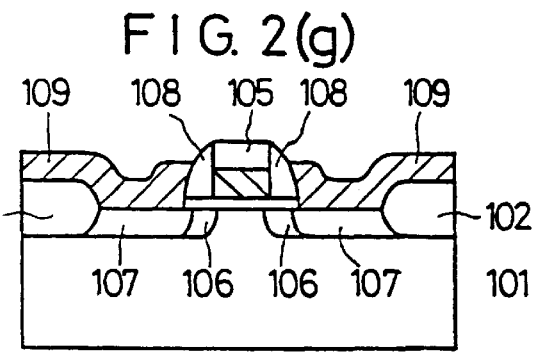
Figure 2D:
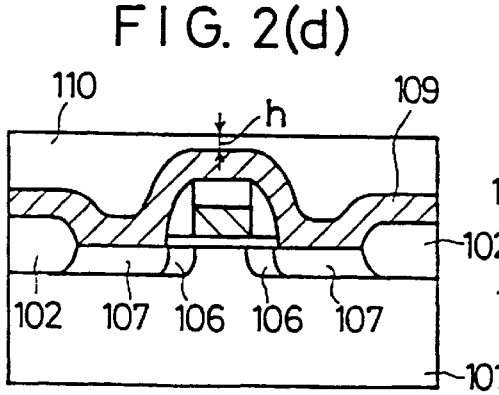

After the conductor film 109 is deposited, a flattening film 110 is formed as shown in FIG. 2(d). The flattening film 110 is formed so that when the flattening film 110 is etched back, a region of the conductor film 109 which is over the gate electrode 104, and which is higher than other regions, is exposed and is etched. The flattening film 110 should be composed of a film that can be easily removed if it is not desired to have it remain. For instance, a photoresist film may be applied and baked. Alternatively, a polyimide film may be applied and baked. Furthermore, an inorganic silicate glass may be applied and baked. Optionally, an organic silicate glass may be applied and baked. If the flattening film is to remain, it is recommended to use a film that does not affect the characteristics of the semiconductor device. For instance, an inorganic or an organic silicate glass, polyimide film, or the like can be used. Alternatively, a flattening film composed of a CVD film or a like film may be used.

The surface of the semiconductor device is flattened as described above. The insulating film 105 is disposed on the gate electrode film 104 and is higher than other regions of the device. When the flattening film 110 is formed, therefore, the thickness h of the flattening film 110 over the gate electrode becomes much thinner than that of other regions, as shown in FIG. 2(d). Next, as shown in FIG. 2(e), a window is formed in a region of the conductor film 109 to be etched over the gate electrode film 104. The region 112 for forming the window may be considerably large provided it is placed at a high location and is not overlapped on the regions where it is not desired to etch the conductor film.

That is, the region 112 for forming the window, which is formed by disposing a photoresist film 111 over the flattening film 110, as shown in FIG. 2(e), may be greater than the length of the gate electrode 104. In FIG. 2(e), the length of the window or opening is greater than a combined length of the gate electrode and side wall insulating film 108.

Therefore, any limitation in downsizing is independent of the size of the window.

Referring next to FIG. 2(f), the flattening film 110 is etched. The flattening film 110 over the gate electrode has a thickness h which is smaller than that at other portions of the device, and the conductor film 109 on the gate electrode is exposed before any other regions. The conductor film 109 that is exposed is then etched. Thus, the conductor film 109 located over the gate electrode 104 is etched preferentially. Under the condition in which the flattening film 110 and the conductor film 109 are etched at an equal speed, it is acceptable to etch the conductor film 109 over the gate electrode 104 uniformly and flatly. The conductor film 109 as well as the first insulating film 105 and the side wall-insulating film 108 under the conductor film 109 must be etched in a proper speed ratio. That is, the insulating film 105 and the side wall-insulating film 108 surrounding the gate electrode film 104 must remain after the conductor film 109 is etched. The conductor film 109 should be etched at a speed higher than the insulating film 105 and the side wall-insulating film 108.

As described above, the conductor film 109 on the gate electrode film 104 can be reliably etched no matter how small the gate electrode/wiring film 104 is. While etching the conductor film 109, furthermore, the semiconductor substrate 101 is not etched due to the presence of the side wall-insulating film 108. Therefore, the transistor characteristics are not affected.

Next, the photoresist 111 is removed and the flattening film 110 is removed as shown in FIG. 2(g). The flattening film 110 that is to remain need not be removed. Moreover, though the photoresist was used for the patterning, any other material may be used provided it is suited to effecting the patterning.

Next, the conductor film 109 is patterned to form a wiring. The wiring may be formed prior to forming the flattening film. Here, however, consideration must be given to the patterning (FIG. 2(e)) at the time when the conductor film 109 on the gate electrode 104 is to be etched.

Figure 2H:
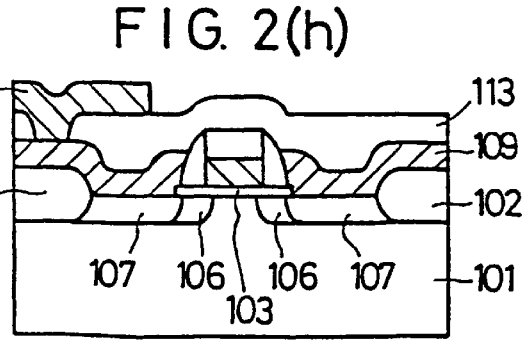

Then, as shown in FIG. 2(h), a second wiring 114 and the like are formed to complete the semiconductor device.

According to the present invention, the insulating film 105 is formed on the gate electrode film 104, and the conductor film 109 is deposited thereon. Therefore, this region is higher than other regions of the device. When the flattening film 110 is formed, therefore, the thickness of the flattening film 110 in this region becomes considerably smaller than that of other regions. Therefore, the etching effected for the whole surface causes the flattening film 110 disposed in this region to be completely removed, first, and the conductor film 109 to be exposed. As the etching is further continued, the conductor film 109 in this region is completely etched, but remains on other regions. Generally, the conductor film 109 at the next-highest position of the semiconductor device is not all etched. Therefore, the region that should not be etched is covered with a photoresist as performed by the present invention, and a window is formed in only the region that is desired to be etched as contemplated by the present invention. In this case, formation of a window over too broad a region decreases the margin of acceptable etching condition for the flattening film 110 and the conductor film 109. Therefore, the window need not be formed over too wide a region. That is, the window is formed and etched over a small region of the conductor film 109 that must be etched on the insulating film 105 that is formed on the gate electrode film 104. There will not arise any problem when a region equal to minimum rule+ alignment precision of the process is formed in a window. This makes it possible to reliably remove the conductor film 109 from a desired place. Furthermore, it is acceptable to form the window broader than the minimum rule even in the region in which the gate electrode and the wiring are patterned with the minimum rule of the process, enabling the conductor film 109 to be reliably removed from this region. Therefore, the present invention makes it possible to form a semiconductor device of the self-aligned type even when it is a semiconductor device formed by the minimum patterning in the photolithography method; i.e., very fine semiconductor devices and integrated circuits can be formed. In the case of the transistor which is not of the self-aligned type, the size according to a 0.8 $\mu$m rule is 6.4 $\mu$m (distance between element isolation and contact edge 1.0 $\mu$m×2+ contact size 0.8 $\mu$m×2+distance between contact edge and edge of gate electrode 1.0 $\mu$m×2+gate electrode width 0.8 $\mu$m) or the size according to a 0.6 $\mu$m rule is 5.0 $\mu$m (distance between element isolation and contact edge 0.8 $\mu$m×2+ contact size 0.6×2+distance between contact edge and edge of gate electrode 0.8 $\mu$m×2+gate electrode width 0.6 $\mu$m). When the present invention is adopted, on the other hand, the size according to a 0.8 $\mu$m rule becomes 3.0 $\mu$m (distance between element isolation and contact edge 0×2+contact size 0.8 $\mu$m×2+distance between contact edge and edge of gate electrode (width of side wall-insulating film) 0.3 $\mu$m×2+gate electrode width 0.8 $\mu$m) or the size according to a 0.6 $\mu$m rule becomes 2.2 $\mu$m (same distance 0×2 +same size 0.6 $\mu$m×2+same size 0.2 $\mu$m×2+same width 0.6$\mu$m), which are very small sizes in comparison to the prior art. The same effects can be obtained with even smaller rules.

What is claimed is:

1. A method of fabricating a MOS device, comprising the steps:

forming a gate insulating film on a semiconductor substrate;

forming a gate electrode film on the gate insulating film;

forming a first insulating film on the gate electrode film;

forming a first photoresist film on the first insulating film, the first photoresist film being patterned;

patterning the gate electrode film and the first insulating film by using the first patterned photoresist film as a mask to form a patterned gate electrode film and first insulating film which are higher than the semiconductor substrate;

forming impurity source and drain layers in a face of the semiconductor substrate by using the patterned gate electrode film as a mask;

forming a second insulating film on an exposed surface of the first insulating film;

etching the second insulating film to form a side wall insulating film on the side wall of the gate electrode and to expose a surface of the semiconductor substrate;

forming a conductor film on the exposed surface of the semiconductor substrate, the first insulating film and the side wall insulating film;

forming a flattening film having a flat surface over the conductor film;

forming a second photoresist film over the flattening film, the second photoresist film being patterned and having an opening over the gate electrode, the opening having a length greater than a combined length of the gate electrode and the side wall insulating film; and etching a region of the flattening film and the conductor film which is above the gate electrode film, using the second patterned photoresist film as a mask.

2. A method of fabricating a MOS device as claimed in claim 1, wherein the side wall insulating film is formed by an anisotropic etching.

3. A method of fabricating a MOS device, comprising the steps:

forming a gate insulating film on a semiconductor substrate;

forming a gate electrode film on the gate insulating film;

forming a first insulating film on the gate electrode film;

forming a first photoresist film on the first insulating film, the first photoresist film being patterned;

patterning the gate electrode film and the first insulating film by using the first patterned photoresist film as a mask to form a patterned gate electrode film and first insulating film which are higher than the semiconductor substrate;

forming low concentration impurity source and drain layers in a face of the semiconductor substrate by using the patterned gate electrode film as a mask;

forming a second insulating film on an exposed surface of the gate insulating film and the first insulating film;

etching the second insulating film to form a side wall insulating film on the side wall of the gate electrode and to expose a surface of the semiconductor substrate;

forming high concentration impurity source and drain layers in a face of the semiconductor substrate by using the patterned gate electrode film and the side wall insulating film as a mask;

forming a conductor film on the exposed surface of the semiconductor substrate, the first insulating film and the side wall insulating film;

forming a flattening film over the conductor film;

forming a second photoresist film over the flattening film, the second photoresist film being patterned and having an opening over the gate electrode, the opening having a length greater than a combined length of the gate electrode and the side wall insulating film; and etching a region of the flattening film and the conductor film which is above the gate electrode film, using the second patterned photoresist film as a mask.

4. A method of fabricating a MOS device as claimed in claim 3, wherein the side wall insulating film is formed by an anisotropic etching.

5. A method of fabricating a MOS device, comprising the steps: forming a gate insulating film on a semiconductor substrate; forming a gate electrode film on the gate insulating film; forming a first insulating film on the gate electrode film; forming a first photoresist film on the first insulating film, the first photoresist film being patterned; patterning the gate electrode film and the first insulating film by using the first patterned photoresist film as a mask to form a patterned gate electrode film and first insulating film which are higher than the semiconductor substrate; forming impurity source and drain layers in a face of the semiconductor substrate by using the patterned gate electrode film as a mask; forming a second insulating film on an exposed surface of the gate insulating film and the first insulating film; etching the second insulating film to form a side wall insulating film on the side wall of the gate electrode and to expose a surface of the semiconductor substrate; forming a conductor film on the exposed surface of the semiconductor substrate, the first insulating film and the side wall insulating film; forming a flattening film over the conductor film; forming a second photoresist film over the flattening film, the second photoresist film being patterned and having an opening over the gate electrode, the opening having a length greater than a combined length of the gate electrode and the side wall insulating film; and etching a region of the flattening film and the conductor film which is above the gate electrode film, using the second patterned photoresist film as a mask.

6. A method of fabricating a MOS device, comprising the steps: forming a gate insulating film on a semiconductor substrate; forming a gate electrode film on the gate insulating film; forming a first insulating film on the gate electrode film; forming a first photoresist film on the first insulating film, the first photoresist film being patterned; patterning the gate electrode film and the first insulating film by using the first patterned photoresist film as a mask to form a patterned gate electrode film and first insulating film which are higher than the semiconductor substrate; forming low concentration impurity source and drain layers in a face of the semiconductor substrate by using the patterned gate electrode film as a mask; forming a second insulating film on an exposed surface of the gate insulating film and the first insulating film; etching the second insulating film to form a side wall insulating film on the side wall of the gate electrode and to expose a surface of the semiconductor substrate; forming high concentration impurity source and drain layers in a face of the semiconductor substrate by using the patterned gate electrode film and the side wall insulating film as a mask; forming a conductor film on the exposed surface of the semiconductor substrate, the first insulating film and the side wall insulating film; forming a flattening film over the conductor film; forming a second photoresist film over the flattening film, the second photoresist film being patterned and having an opening over the gate electrode, the opening having a length greater than a combined length of the gate electrode and the side wall insulating film; and etching a region of the flattening film and the conductor film which is above the gate electrode film, using the second patterned photoresist film as a mask.

* * * * *